United States Patent
Baran et al.

(10) Patent No.: US 9,728,262 B2
(45) Date of Patent: Aug. 8, 2017

(54) NON-VOLATILE MEMORY SYSTEMS WITH MULTI-WRITE DIRECTION MEMORY UNITS

(71) Applicant: SanDisk Technologies Inc., Plano, TX (US)

(72) Inventors: Ivan Baran, San Jose, CA (US); Aaron Lee, Mountain View, CA (US); Mrinal Kochar, San Jose, CA (US); Mikhail Palityka, Oakville (CA); Dennis Ea, Hayward, CA (US); Yew Yin Ng, Milpitas, CA (US); Abhijeet Bhalerao, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/928,509

(22) Filed: Oct. 30, 2015

(65) Prior Publication Data

US 2017/0125104 A1    May 4, 2017

(51) Int. Cl.
   G11C 16/04    (2006.01)
   G11C 16/14    (2006.01)
   G11C 16/34    (2006.01)

(52) U.S. Cl.
   CPC ............ *G11C 16/14* (2013.01); *G11C 16/349* (2013.01)

(58) Field of Classification Search
   CPC .............................. G11C 16/14; G11C 16/349
   (Continued)

(56) References Cited

U.S. PATENT DOCUMENTS

| 5,798,966 A | * | 8/1998 | Keeney | G11C 16/30 365/185.18 |
| 2003/0161192 A1 | * | 8/2003 | Kobayashi | G11C 16/0475 365/200 |

(Continued)

FOREIGN PATENT DOCUMENTS

| EP | 1 943 652 | 7/2008 |
| WO | 2009/037691 | 3/2009 |
| WO | 2015/092879 | 6/2015 |

OTHER PUBLICATIONS

International Search Report and Written Opinion for corresponding PCT application No. PCT/US2016/051597, dated Nov. 23, 2016, 6 pages.

(Continued)

*Primary Examiner* — Tha-O H Bui
(74) *Attorney, Agent, or Firm* — Brinks Gilson & Lione

(57) ABSTRACT

Non-volatile memory systems with multi-write direction memory units are disclosed. In one implementation an apparatus comprises a non-volatile memory and a controller in communication with the non-volatile memory. The controller is configured to select an empty memory block of the non-volatile memory for the storage of data; examine an identifier associated with the memory block to determine a write direction for the storage of data; and write data to the memory block beginning with an initial word line of the memory block or a last word line of the memory block dependent on the write direction. The controller is further configured to erase the memory unit and, in response to erasing the memory unit, modify the identifier to change the write direction for a subsequent write of data to the memory block.

14 Claims, 9 Drawing Sheets

(58) Field of Classification Search
USPC ............. 365/185.11, 185.03, 185.17, 185.33
See application file for complete search history.

(56) References Cited

U.S. PATENT DOCUMENTS

| | | | |
|---|---|---|---|
| 2008/0253191 A1* | 10/2008 | Kang | G11C 16/20 365/185.18 |
| 2009/0157947 A1* | 6/2009 | Lin | G06F 12/0246 711/103 |
| 2009/0313419 A1 | 12/2009 | Han | |
| 2010/0246266 A1* | 9/2010 | Park | G11C 16/10 365/185.18 |
| 2012/0081962 A1 | 4/2012 | Tsai et al. | |
| 2012/0170365 A1 | 7/2012 | Kang et al. | |
| 2014/0013033 A1* | 1/2014 | Sharon | G06F 11/1072 711/103 |
| 2015/0098271 A1 | 4/2015 | Lasser | |

OTHER PUBLICATIONS

Written Opinion for corresponding PCT application No. PCT/US2016/051597, dated Nov. 23, 2016, 7 pages.

\* cited by examiner

NON-VOLATILE MEMORY SYSTEMS WITH MULTI-WRITE DIRECTION MEMORY UNITS

BACKGROUND

In conventional non-volatile memory systems such as flash memory systems, controllers program rows of a NAND array in a prescribed sequential order beginning with a row along an initial word line that is closest to an end of memory cell strings connected to a ground or another common potential. The controller then programs a row of memory cells along a next sequential word line moving away from the initial word line, and so on, through a memory block.

As the controller programs the word lines closest to an end of memory cell strings connected to a ground or another common potential, voltage disturbances accumulate on the unprogrammed word lines farthest from the initial word line. Generally, during a programming operation, as the controller deselects word lines, some voltage may still be applied to the deselected word lines. For erased word lines, the voltage may be high enough to cause disturbance to memory cells, even though the voltage may not be high enough to trigger actual programming of the memory cells. Word lines that the controller has already programmed experience much less voltage disturbance because the potential difference is lower due to some charge being present on the floating gate associated with the word line. Because the word lines furthest from an initially programmed word line often remain erased often during programming, the word lines furthest from the initially programmed word line often accumulate the most voltage disturbance. These accumulate of voltage disturbances result in memory cell degradation and affect the perform of the memory system during any activity. This accumulation of voltage can cause word lines to fail or increase a rate at which memory cells break down, thereby affecting an endurance of the memory system.

DETAILED DESCRIPTION OF THE DRAWINGS

Figure 1A:
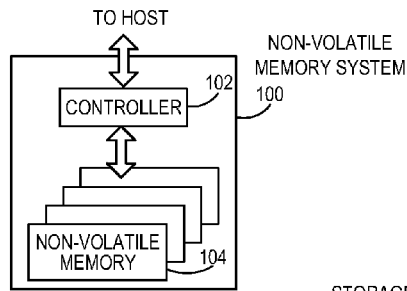
FIG. 1A is a block diagram of an example non-volatile memory system.

The present disclosure is directed to non-volatile memory systems with multi-write direction memory units. As discussed above, when a controller of a non-volatile memory system writes data to an empty memory unit, such as a memory block, beginning with an initial word line of the memory unit, disturbances are generated at word lines at the end of the memory unit. These disturbances accumulate over time on word lines at the end of the memory unit as the controller repeatedly writes data to the memory unit. As the disturbances accumulate, the overall disturbance on the word lines at the end of the memory unit increases, which can result in the word lines at the end of the memory unit failing earlier than the word lines at the beginning of the memory unit.

In the non-volatile memory systems described in present application, a controller of the non-volatile memory system is able to reverse a direction with which the controller writes data to a memory unit. For example, the controller may write data to a memory unit in a forward direction beginning with an initial word line of the memory unit and then a next sequential word line of the memory unit. During the writes in a forward direction, disturbances may accumulate on word lines at an end of the memory unit.

After the memory unit is erased, the controller may reverse the write direction for a next data write to the memory unit. Accordingly, the controller may write data to the memory unit in a reverse direction beginning with a last word line of the memory unit and then a previous sequential word line of the memory unit. During the writes in a reverse direction, disturbances may accumulate on word lines at a beginning of the memory unit.

It will be appreciated that because the controller reverses the data write directions, over time the disturbances are distributed across the word lines at the beginning of the memory unit and the word lines at the end of the memory unit. Therefore, by periodically reversing a write direction, an overall disturbance on the word lines at the end of the memory unit are less over time when compared to the overall disturbances that typically accumulate on word lines at an end of a memory block when controllers only write data to a memory block in a forward direction. The distribution of disturbances across the word lines at the beginning and end of the memory unit reduces a maximum disturbance that will accumulate on any one word line, thereby increasing an endurance of the memory unit.

In one embodiment, a method is disclosed. The elements of the method occur in a controller of a non-volatile memory system. In the method, an empty memory unit of a non-volatile memory of the non-volatile memory system is selected for the storage of data. An identifier associated with the memory unit is examined to determine a write direction for the storage of data in the memory unit. Data is then written to the memory unit in the write direction.

In another embodiment, an apparatus disclosed. The apparatus comprises a non-volatile memory and a controller in communication with the processing circuitry. The controller is configured to select an empty memory block of a the non-volatile memory for the storage of data; examine a counter associated with the memory block to determine a write direction for the storage of data; and write data to the memory block beginning with an initial word line of the memory block or a last word line of the memory block dependent on the write direction.

In yet another embodiment, another method is disclosed. The elements of the method occur in a controller of a non-volatile memory system. In the method, a determination is made of whether to write data to a memory unit of a non-volatile memory of the non-volatile memory system in a forward direction or a reverse direction based on a previous write direction with which the controller wrote data to the memory unit. Data is then written to the memory unit beginning with one of an initial word line or a last word line associated with the memory unit based on the determination of whether to write data to the memory unit in the forward direction or the reverse direction.

Other embodiments and implementations are possible, and each of the embodiments can be used alone or together in combination. Accordingly, various embodiments and implementations will be described with reference to the attached drawings.

Figure 1B:
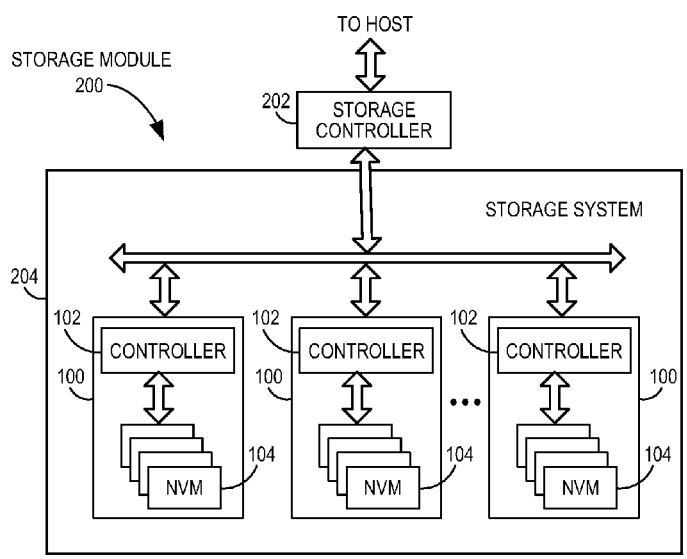
FIG. 1B is a block diagram illustrating an exemplary storage module.
Figure 1C:
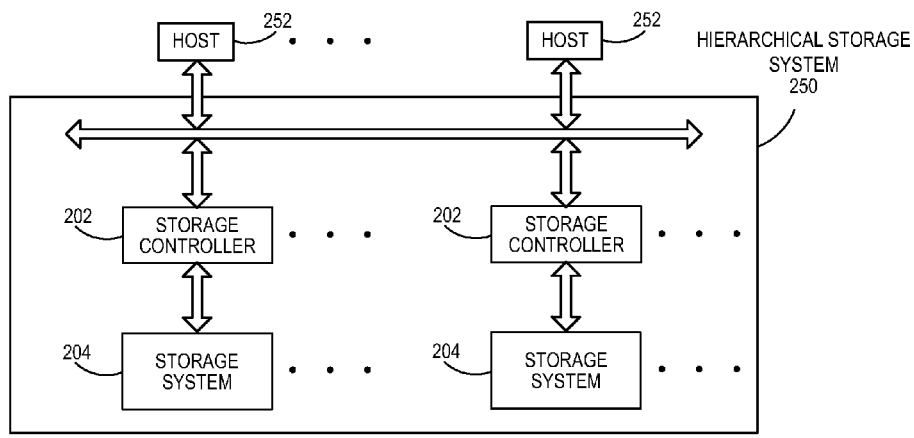
FIG. 1C is a block diagram illustrating a hierarchical storage system.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
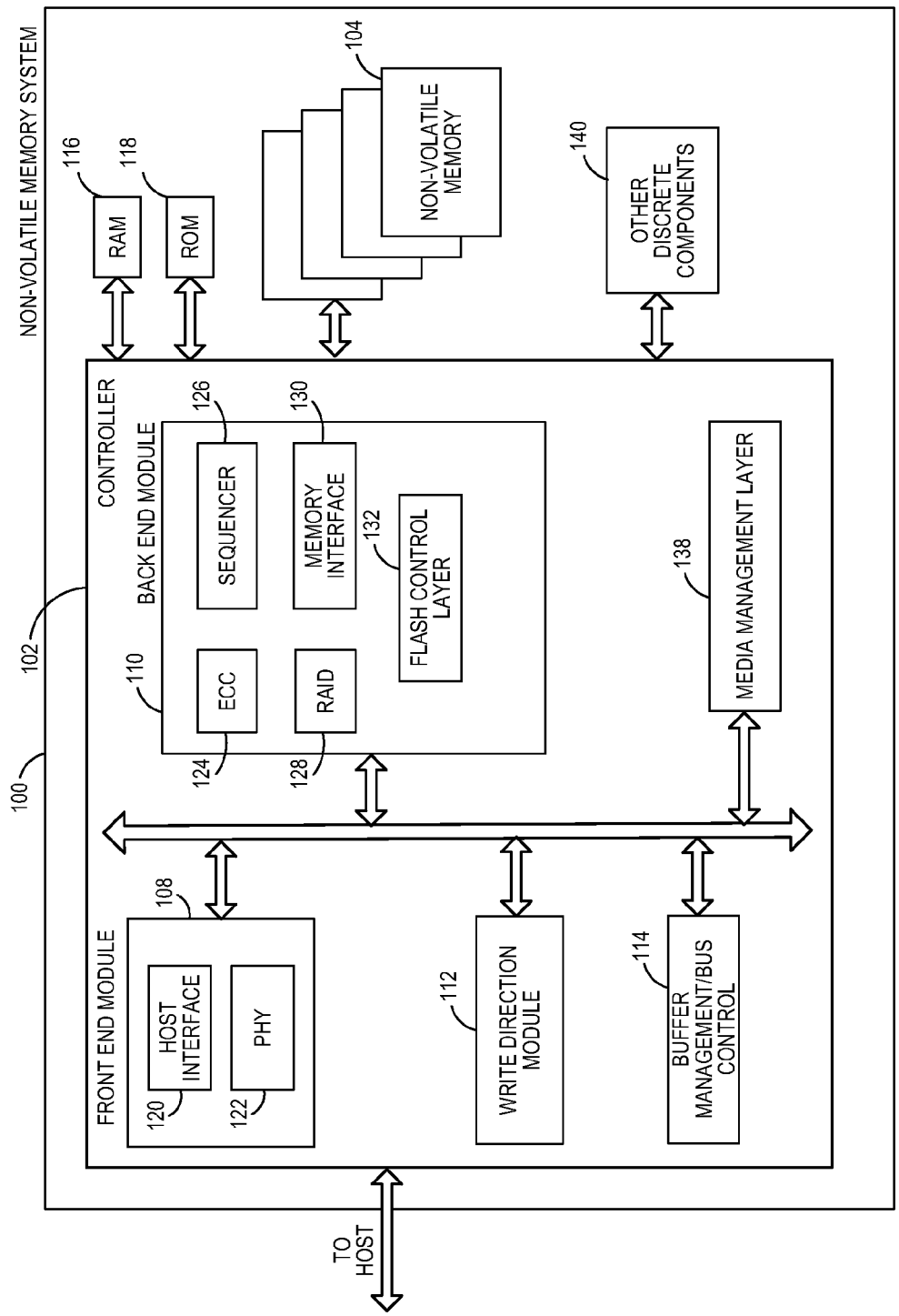
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a write direction module 112 that is present on the same die as the controller 102. As explained in more detail below in conjunction with FIGS. 7 and 8, the memory write direction module 112 may perform operations that direct the controller 102 to change a direction with which data is written to a memory unit such as a memory block. In some implementations, the write direction module 112 may change the write direction between a forward direction and a reverse direction.

In some implementations, when writing data to a memory unit in a forward direction, the controller 102 writes data to a memory unit beginning with a first word line of the memory unit and may continue writing to the memory unit utilizing a next sequential word line in a direction towards a last word line of the memory unit. When writing data to the memory unit in a reverse direction, the controller 102 writes data to the memory unit beginning with the last word line of the memory unit and may continue writing to the memory unit utilizing a next sequential word line in a direction towards the first word line.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a dual data rate (DDR) interface, such as a Toggle Mode 200, 400, or 800 interface. A flash control layer 132 controls the overall operation of back end module 110.

Additional components of system 100 illustrated in FIG. 2A include media management layer 138 to perform wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
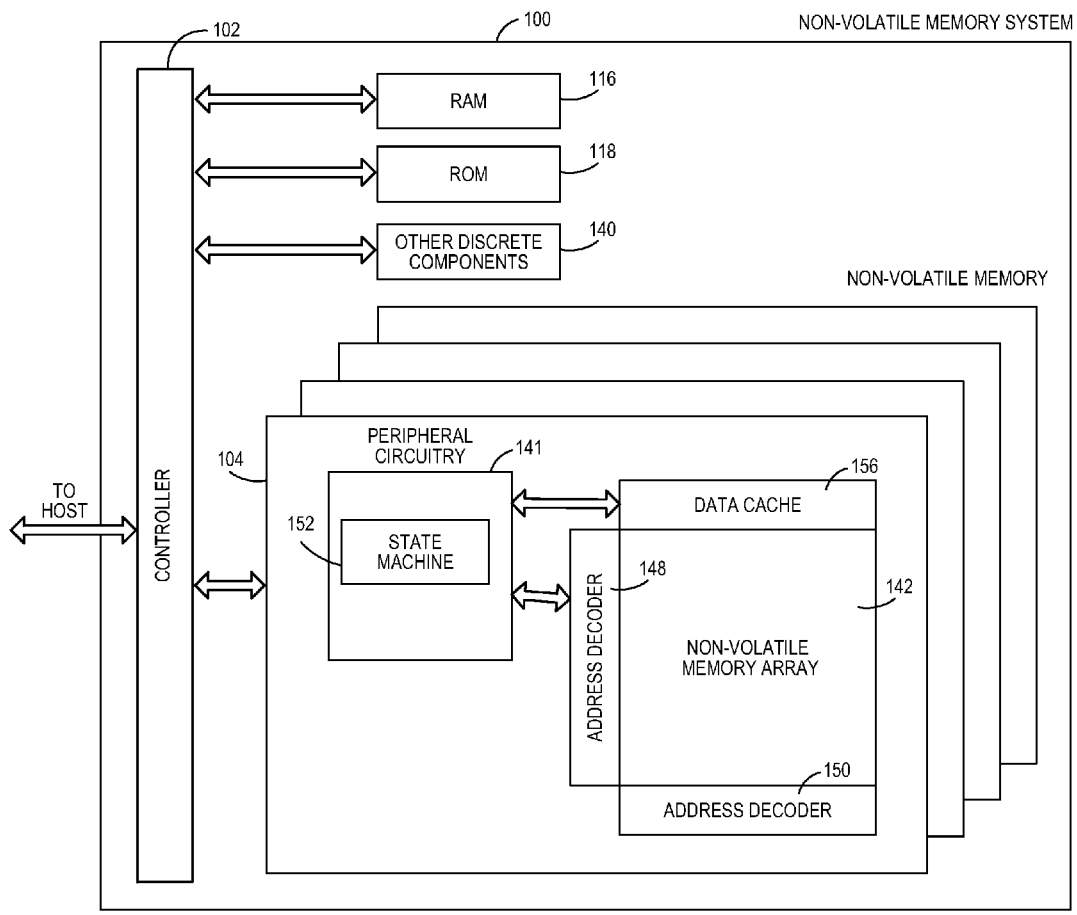
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

Each non-volatile memory die 104 may contain an array of memory cells organized into multiple planes. An example NAND array is illustrated in FIG. 3A.

Figure 3A:
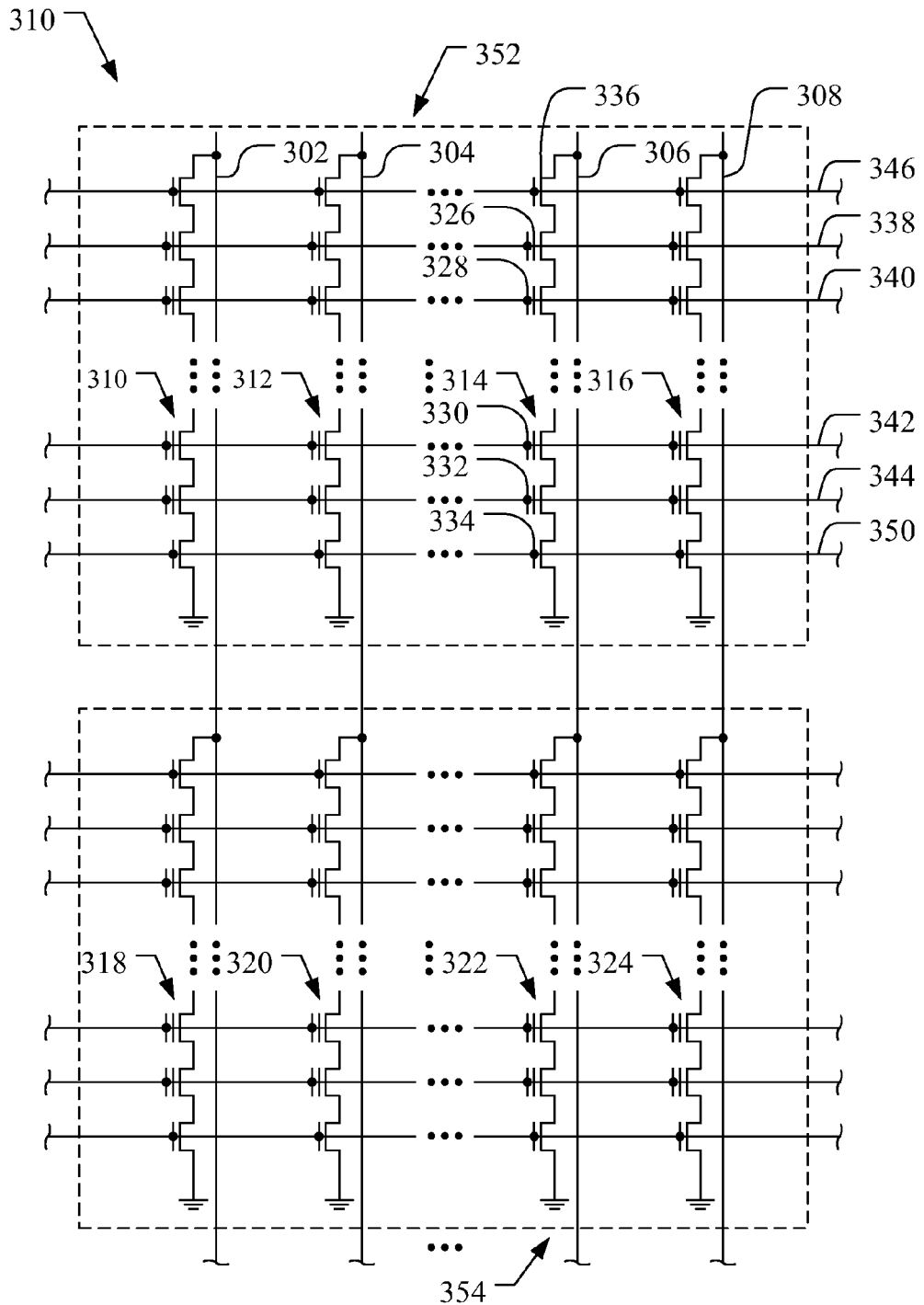
FIG. 3A is a representative circuit diagram of a memory cell array.

While a large number of global bit lines are provided in a NAND array, only four such lines 302-308 are shown in FIG. 3A for simplicity of explanation. A number of series connected memory cell strings 310-324 are connected between one of these bit lines and a reference potential. Using the memory cell string 314 as representative, a plurality of charge storage memory cells 326-332 are connected in series with select transistors 334 and 336 at either end of the string. When the select transistors of a string are rendered conductive, the string is connected between its bit line and the reference potential. One memory cell within that string is then programmed or read at a time.

Word lines 338-344 of FIG. 3A individually extend across the charge storage element of one memory cell in each of a number of strings of memory cells, and gates 346 and 350 control the states of the select transistors at each end of the strings. The memory cell strings that share common word and control gate lines 338-350 are made to form a block 352 of memory cells that are erased together. This block of cells contains the minimum number of cells that are physically erasable at one time. One row of memory cells, those along one of the word lines 338-344, are programmed at a time.

Conventionally, the rows of a NAND array are programmed in a prescribed sequential order, in this case beginning with the row along the word line 344 closest to the end of the strings connected to ground or another common potential. The row of memory cells along the word line 342 is programmed next, and so on, throughout the block 352.

A second block 354 is similar, its strings of memory cells being connected to the same global bit lines as the strings in the first block 352 but having a different set of word and control gate lines. The word and control gate lines are driven to their proper operating voltages by row control circuits. If there is more than one plane in the system, one memory architecture uses common word lines extending between them. There can alternatively be more than two planes that share common word lines. In other memory architectures, the word lines of individual planes are separately driven.

While the example NAND array illustrated in FIG. 3A has been used to describe a process for writing data to a memory block in a forward direction, to write data to a memory block in either a forward direction or a reverse direction, a controller may change which end of the memory cell strings is connected is connected a ground or other common potential.

Figure 3B:
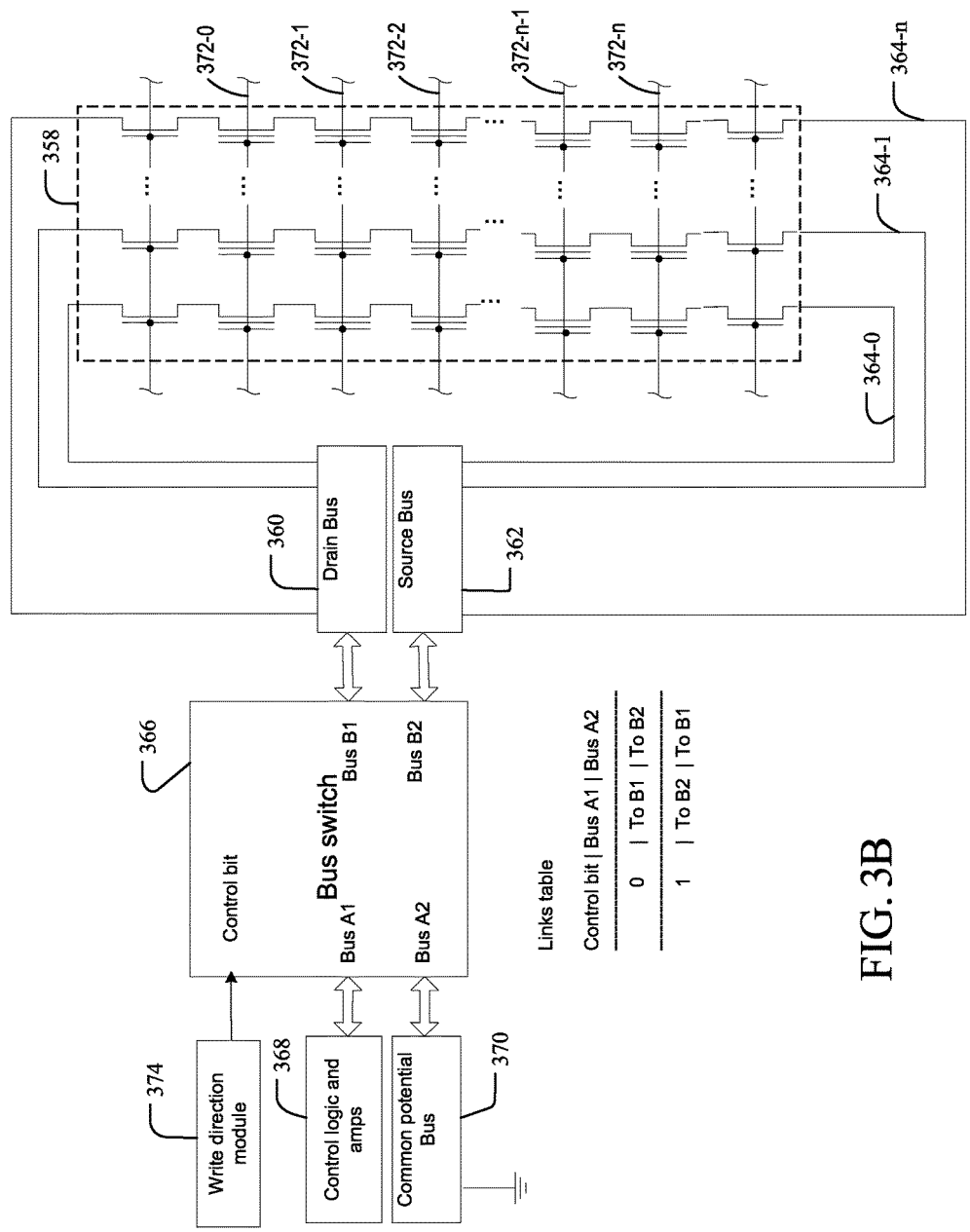
FIG. 3B is a representative circuit diagram of a memory cell array and associated circuits that may write data to a memory block in a forward direction or a reverse direction.

FIG. 3B illustrates an example NAND array and circuitry that is able to write data to a memory block 358 in a forward direction and a reverse direction. As shown, a drain bus 360 and a source bus 362 are in communication with a number of global bit lines 364-0, 364-1, . . . 364-n associated with the memory block 358.

A bus switch 366 is in communication with the drain bus 360 and the source bus 362. The bus switch 366 is additionally in communication with a set of control logic and amplifiers 368 and a common potential bus 370. In some implementations, the drain bus 360, source bus 362, bus switch 366, control logic and amplifiers 368, and the common potential bus 370 are part of the NAND memory and present on a die of the NAND.

The bus switch is configured to operate in at least two modes to apply the control logic and amps 268 or the common potential bus 370 to the drain bus 360 and the source bus 362.

In a first mode, the bus switch 366 applies the set of control logic and amplifiers 368 to the drain bus 260 and applies the common potential bus 370 to the source bus 362. When operating in the first mode, data is written to the memory block in a forward direction similar to that described above in conjunction with FIG. 3A. The controller writes data to the memory block 358 beginning at a first word line 372-0, and may continue writing data in a forward direction at a next subsequent word line 372-1.

In a second mode, the bus switch 366 applies the set of control logic and amplifiers 368 to the source bus 262 and applies the common potential bus 370 to the drain bus 360. By changing which of the control logic and amps 368 and the common potential bus 370 are applied to the drain bus 360 and the source bus 362 from the first mode, the controller is able to change the write direction to write data to the memory block 358 in a reverse direction. When operating in the second mode, the controller initially writes data to the memory block 358 beginning at a last word line 372-n, and may continue writing data in a reverse direction at a previous sequential word line 372-n−1.

The write detection module 374 of the controller is in communication with the bus switch 366 and may control whether the bus switch 366 applies the control logic and amplifiers 368 or the common potential bus 370 to the drain bus 360 or the source bus 362. In one implementation, the write detection module 374 may instruct the bus switch 366 through the use of a control bit.

As shown in FIG. 3B, the write detection module 374 may use a control bit value of zero to instruct the bus switch 366 to connect the control logic and amplifiers 368 to the drain bus 360 and to connect the common potential bus 370 to the source bus 362. Further, the write detection module 374 may use a control bit value of one to instruct the bus switch 366 to connect the control logic and amplifiers 368 to the source bus 362 and to connect the common potential bus 370 to the drain bus 360.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4:
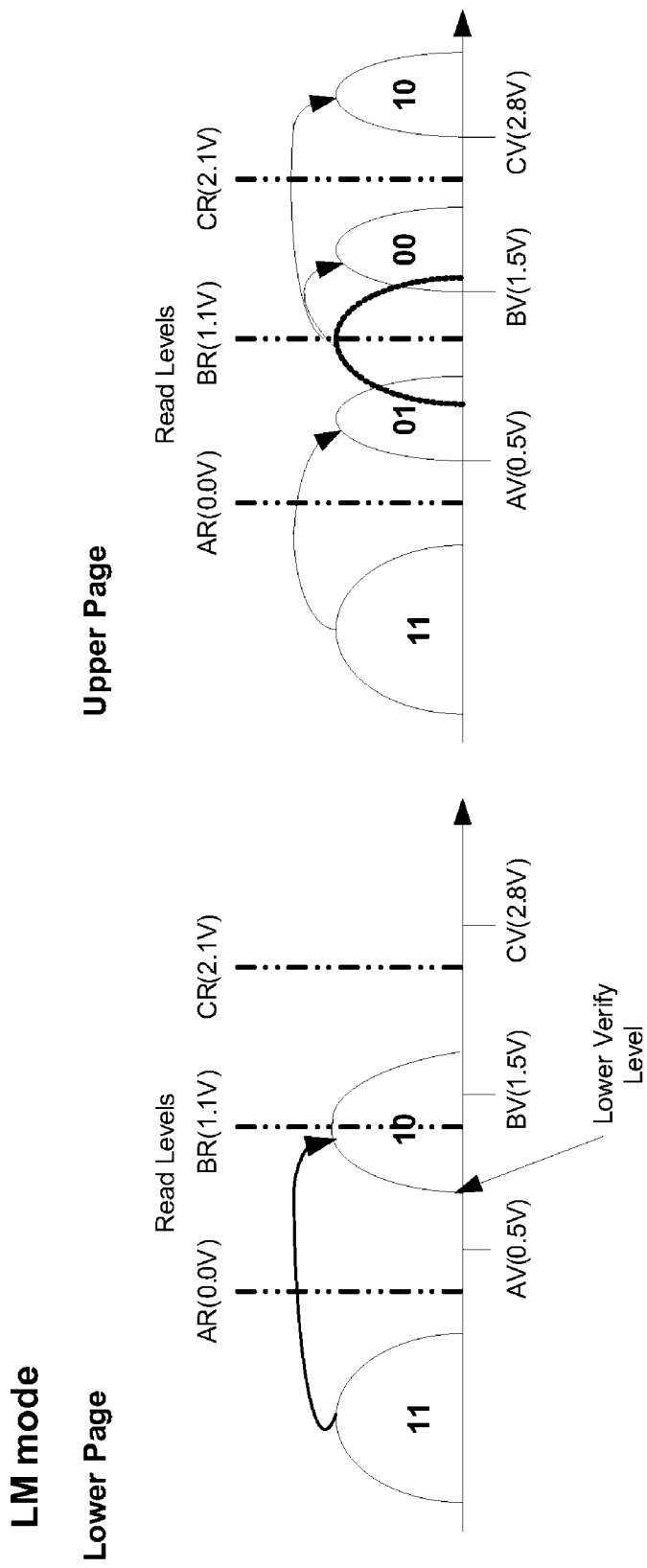
FIG. 4 illustrates charge levels in a MLC memory operated to store two bits of data in a memory cell.

FIG. 4 illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
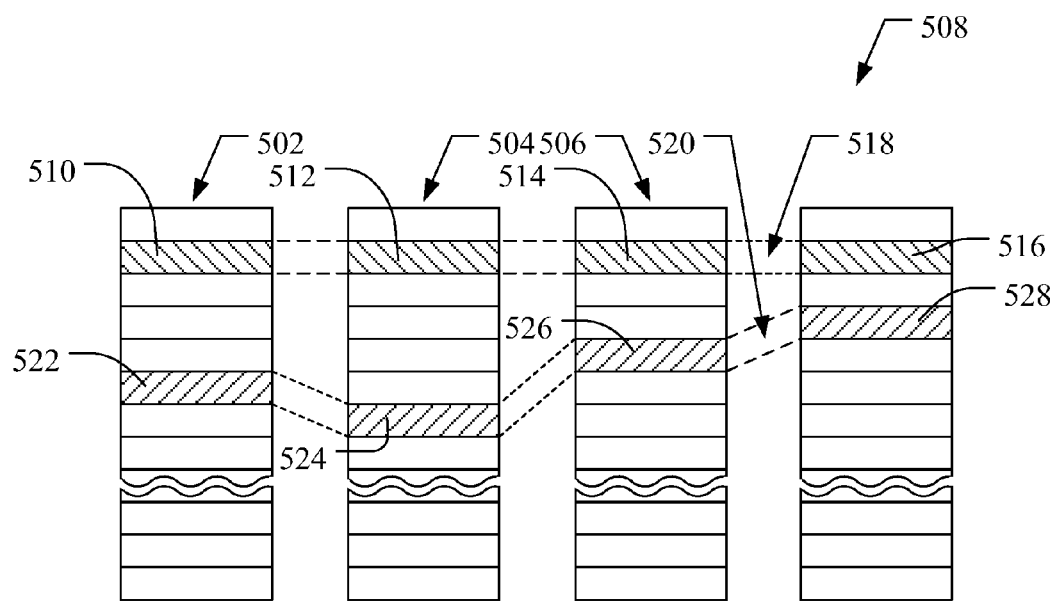
FIG. 5 illustrates an example physical memory organization of a memory bank.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds or thousands or more of blocks in each plane.

As mentioned above, a block of memory cells is the unit of erase, the smallest number of memory cells that are physically erasable together. Some non-volatile memory systems, for increased parallelism, operate the blocks in larger metablock units. However, other memory systems may utilize asynchronous memory die formations rather than operating in larger metablock units.

In non-volatile memory systems utilizing metablock units, one block from each plane is logically linked together to form the metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the non-volatile memory systems can be operated with the ability to dynamically form metablocks of any or all of one, two or three blocks in different planes. This allows the size of the metablock to be more closely matched with the amount of data available for storage in one programming operation.

Figure 6:
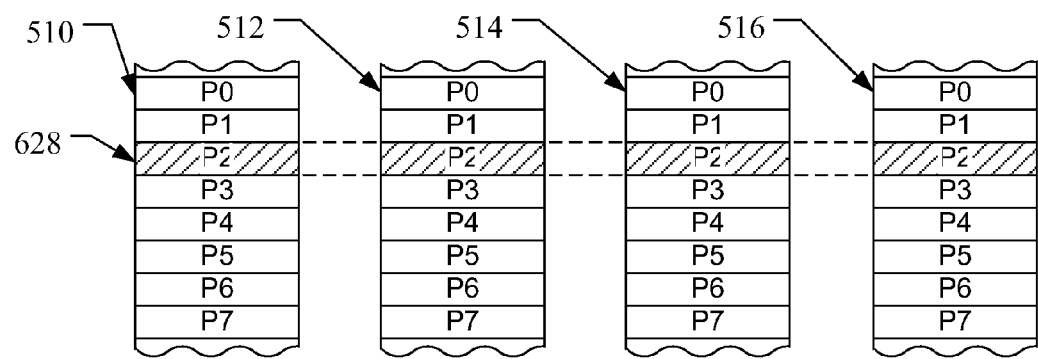
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 16, 32, 64 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 628 is illustrated in FIG. 6, being formed of one physical page from each of the four blocks 510-516. The metapage 628, for example, includes the page P2 in each of the four blocks but the pages of a metapage need not necessarily have the same relative position within each of the blocks.

As mentioned above, when a controller of a non-volatile memory system writes data to an empty memory unit, such as a memory block, beginning with an initial word line of the memory unit, voltage disturbances are generated at word lines at the end of the memory unit. These disturbances accumulate over time on word lines at the end of the memory unit as the controller repeatedly writes data to the memory unit. As the disturbances accumulate, the overall disturbance on the word lines at the end of the memory unit increases, which can result in the word lines at the end of the memory unit failing earlier than the word lines at the beginning of the memory unit.

In the non-volatile memory systems described in the present application, a controller of the non-volatile memory system is able to reverse a direction with which the controller writes data to a memory unit. For example, the controller may write data to a memory unit in a forward direction beginning with an initial word line of the memory unit. Then, after the memory unit is erased, the controller may then write data to the memory unit in a reverse direction beginning with a last word line of the memory unit. It will be appreciated that because the controller reverses the data write direction, over time the disturbances are distributed across the word lines at the beginning of the memory unit and the word lines at the end of the memory unit.

Figure 7:
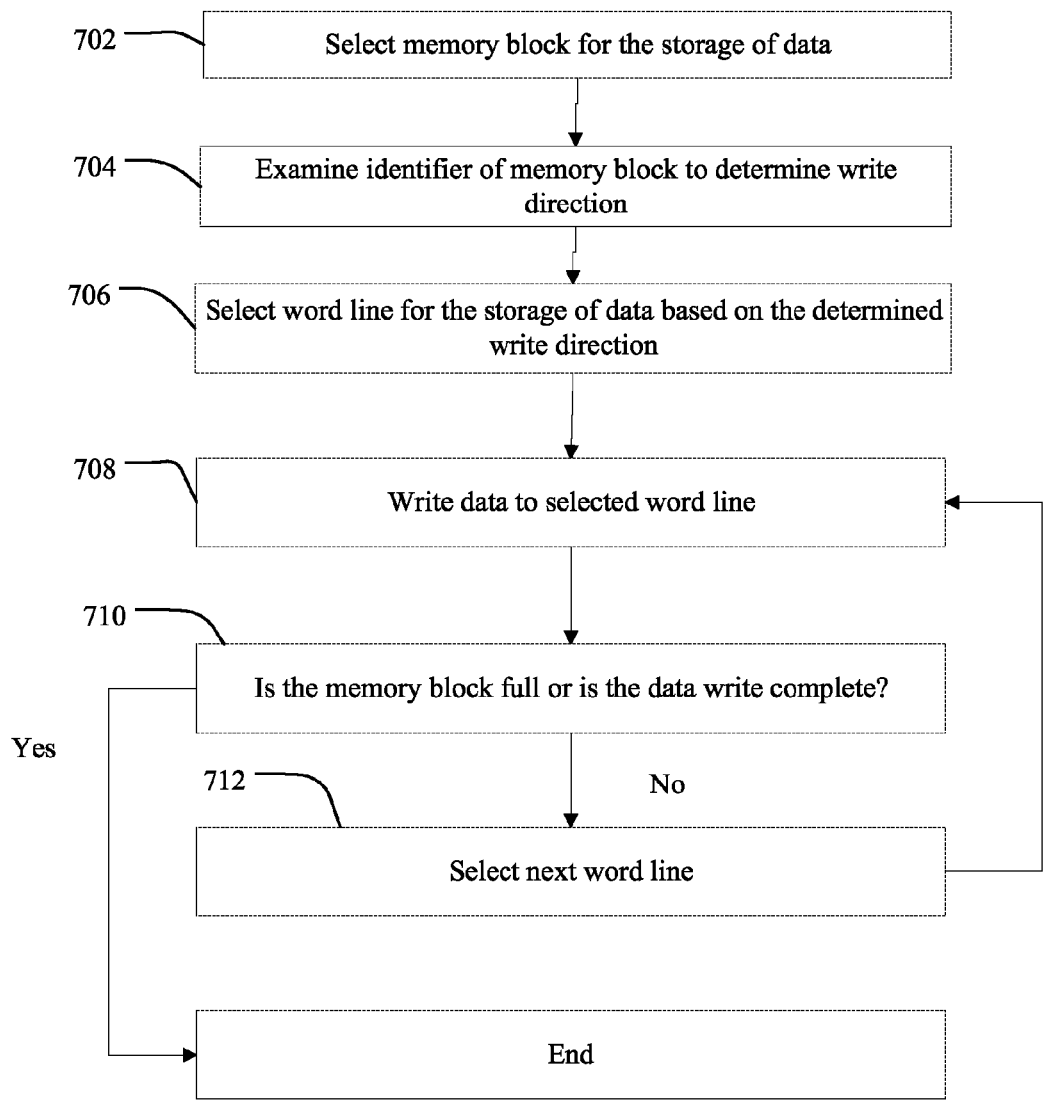
FIG. 7 is a flow chart of one implementation of a method of writing data to multi-write direction memory units.

FIG. 7 is a flow chart of one implementation of a method of writing data to multi-write direction memory units. In the method described below, the memory unit is a memory block. However, other memory units may be used.

At step 702, a controller of a non-volatile storage system selects a memory block of a non-volatile memory of the non-volatile storage system for the storage of data. In some implementations the controller may select an empty memory block from a free block list of the non-volatile memory system. As known in the art, a free block list is a listing of memory blocks at the non-volatile memory system that are available for the storage of data.

At step 704, a write direction module of the controller examines an identifier associated with the memory block to determine a write direction for the memory block. The identifier may be a parity bit of a program/erase cycle counter for the memory block (also known as a hot counter), a counter not directly related to a program/erase cycle count of the memory block, or any other type of identifier that informs the write direction module a write direction that the controller previously wrote to the memory block and/or a write direction that the controller should presently write data to the memory block.

For example, when the identifier is a parity bit of a program/erase cycle counter, the write direction module may determine that the controller should write data to the memory block in a forward direction when the value of the parity bit is zero and that the controller should write to the memory block in a reverse direction when the value of the parity bit is one.

Similarly, when the identifier is a counter, the write direction may determine that the controller should write data to the memory block in a forward direction when the value of the counter is an even number and that the controller should write to the memory block in a reverse direction when the value of the counter is an odd number. As explained in more detail below, the counter may be incremented each time the memory block is erased.

Other arrangements could be implemented with a counter such that the write direction is changed after the counter is incremented a defined number of times. For example, the write direction module could reverse direction of data writes after the counter is incremented five times (corresponding to the memory block being erased five times). Therefore, the controller would write to data to the memory block five times in a forward direction, then five times in a reverse, and then change back to writing data to the memory block in a forward direction.

At step 706, the write direction module selects a starting word line for the data write based on the determination at step 704. When the write direction module determines that the controller should write data to the memory block in a forward direction, the write direction module selects an initial word line of the memory block to begin the data write. Alternatively, when the write direction module determine that the controller should write data to the memory block in a reverse direction, the write direction module selects a last word line of the memory block to begin the data write.

As discussed above in conjunction with FIGS. 3A and 3B, conventional non-volatile memory systems program a memory block only in a forward direction starting with an initial word line of the memory block and continuing to program one or more word lines in a sequential order towards a last word line of the memory block. In the present application, in addition to programming a memory block in a forward direction, a controller is also able to program a memory block in a reverse direction. In the reverse direction, the controller begins with programming a last word line of the memory block and continues to program one or more word lines in a sequential order towards the first word line.

At step 708, the controller writes data to the selected word line. At step 710, the controller determines whether the memory block is full after the data write at step 708 or whether the data write is complete. When the memory block is not full and the data write is not complete, the controller selects a next word line of the memory block for the storage of data at step 712.

When writing data in a forward direction, the controller may select a next sequential word line moving away from the initial word line and towards the last word line for the storage of data. Alternatively, when writing data in a reverse direction, the controller may select a next sequential word line moving away from the last word line and towards the initial word line for the storage of data.

The process is repeated beginning at step 708 until the memory block is full or the memory block is not yet full but the controller has completed the memory write.

The controller continues utilizing the memory block and writing data to the memory block until the controller determines to erase the memory block. It will be appreciated that the write direction module should not shift a write direction for the memory block until the memory block is erased for reuse.

Figure 8:
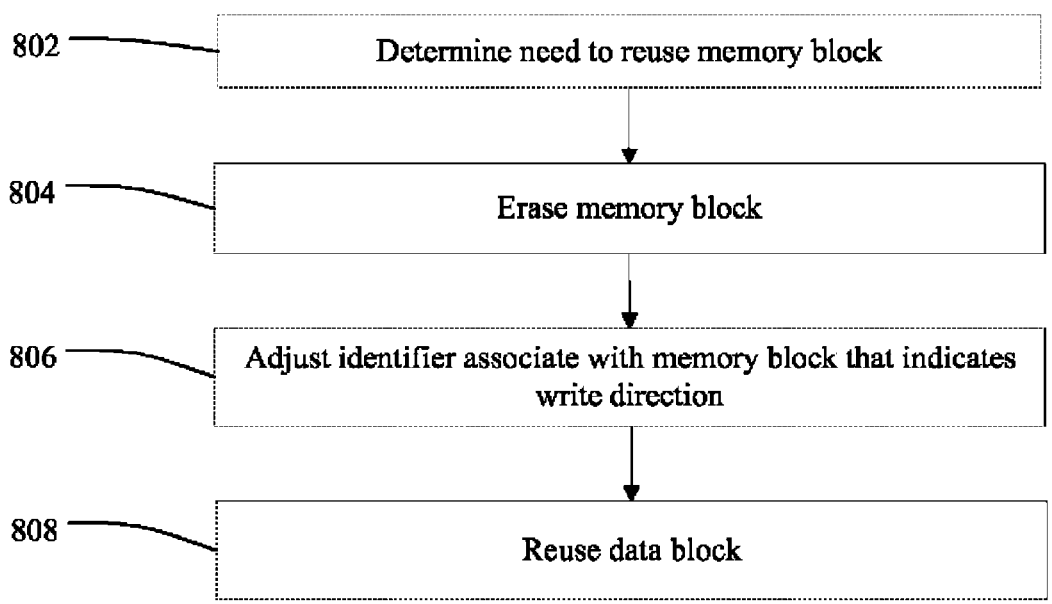
FIG. 8 is a flow chart of one method for erasing a multi-direction memory unit.

FIG. 8 is a flow chart of one method for erasing a multi-direction memory unit. In the method described below, the memory unit is a memory block. However, other memory units may be used.

At step 802, the controller determines a need to reuse the memory block. For example, the controller may determine to reuse the memory block because the memory block no longer contains valid data, because data is being moved from the memory block, and/or during a garbage collection operation on the memory block.

At step 804, the controller erases the memory block, and at step 806, the write direction module of the controller adjusts the identifier associated with the memory block that informs the write direction module a write direction that the controller previously wrote to the memory block and/or a write direction that the controller should write data to the memory block in a next data write. For example, when the identifier is a counter, the write direction module may increment the counter.

At step 808, after erasing the memory block and adjusting the identifier, the controller may perform actions such as placing the memory block on a free block list or performing the operations described above in conjunction with FIG. 7 to write new data to the memory block.

FIGS. 1-8 illustrate non-volatile memory systems with multi-write direction memory units. In implementations of the non-volatile memory systems described above, a write direction module of a controller of the non-volatile memory system is able to reverse a direction with which the controller writes data to a memory unit. Because the controller reverses the data write direction, over time disturbances caused during data writes to a memory unit are distributed across word lines at the beginning of the memory unit and word lines at the end of the memory unit. Therefore, by periodically reversing a write direction, an overall disturbance on the word lines at the end of the memory unit are less over time when compared to the overall disturbances that typically accumulate on word lines at an end of a memory block when controllers only write data to a memory block in a forward direction. The distribution of disturbances across the word lines at the beginning and end of the memory unit reduces a maximum disturbance that will accumulate on any one word line, thereby increasing an endurance of the memory unit.

It is intended that the foregoing detailed description be regarded as illustrative rather than limiting, and that it be understood that it is the following claims, including all equivalents, that are intended to define the spirit and scope of this invention.

For example, in the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The invention claimed is:

1. In a controller of a non-volatile memory system that is coupled with a host device, a method comprising:
selecting a memory unit of a non-volatile memory of the non-volatile memory system that is empty for storage of data;
examining an identifier associated with the memory unit to determine a write direction for the storage of data in the memory unit, the write direction indicating whether to store data to the memory unit in one of a forward write direction or a reverse write direction; and
writing data to the memory unit in the write direction;
wherein writing data to the memory unit in the forward write direction comprises:
writing data to the memory unit beginning with an initial word line of the memory unit and continuing to write data to a next sequential word line in a direction of a last word line of the memory unit while control logic and amps of the non-volatile memory are coupled to a drain bus of the memory unit, and a common potential bus of the non-volatile memory is coupled to a source bus of the memory unit; and
wherein writing data to the memory unit in the reverse write direction comprises:
writing data to the memory unit beginning with the last word line of the memory unit and continuing to write data to a next sequential word line in a direction of the initial word line of the memory unit while the control logic and amps of the non-volatile memory are coupled to the source bus of the memory unit, and the common potential bus of the non-volatile memory is coupled to the drain bus of the memory unit.

2. The method of claim 1, further comprising:
erasing the memory unit; and
modifying the identifier to change the write direction for a subsequent write of data to the memory unit.

3. The method of claim 1, wherein the memory unit is a memory block.

4. The method of claim 1, wherein the identifier is a parity bit of a program/erase cycle counter associated with the memory unit.

5. The method of claim 1, wherein the non-volatile memory comprises a silicon substrate and a plurality of memory cells forming at least two memory layers vertically disposed with respect to each other to form a monolithic three-dimensional structure, wherein at least one layer is vertically disposed with respect to the silicon substrate.

6. An apparatus comprising:
a non-volatile memory; and
a controller in communication with the non-volatile memory, the controller configured to:
select a memory block of the non-volatile memory that is empty for storage of data;
examine a counter associated with the memory block to determine a write direction for the storage of data;
dependent on the write direction:
write data to the memory block beginning with an initial word line of the memory block and continue to write data to a next sequential word line in a direction of a last word line of the memory block while control logic and amps of the non-volatile memory are coupled to a drain bus of the memory block, and a common potential bus of the non-volatile memory is coupled to a source bus of the memory block; or
write data to the memory block beginning with the last word line of the memory block and continue to write data to a next sequential word line in a direction of the initial word line of the memory block while the control logic and amps of the non-volatile memory are coupled to the source bus of the memory block, and the common potential bus of the non-volatile memory is coupled to the drain bus of the memory block.

7. The apparatus of claim 6, wherein the controller is further configured to:
   erase the memory unit; and
   increment the counter to change the write direction for a subsequent write of data to the memory block.

8. The apparatus of claim 6, wherein the non-volatile memory comprises a silicon substrate and a plurality of memory cells forming at least two memory layers vertically disposed with respect to each other to form a monolithic three-dimensional structure, wherein at least one layer is vertically disposed with respect to the silicon substrate.

9. In a controller of a non-volatile memory system that is coupled with a host device, a method comprising:
   determining whether to write data to a memory unit of a non-volatile memory of the non-volatile memory system in a forward write direction or a reverse write direction based on a previous write direction with which the controller wrote data to the memory unit; and
   writing data to the memory unit beginning with one of an initial word line or a last word line of the memory unit based on the determination of whether to write data to the memory unit in the forward direction or the reverse direction;
   wherein writing data to the memory unit in the forward write direction comprises writing data to the memory unit beginning with the initial word line of the memory unit and continuing to write data to a next sequential word line in a direction of the last word line of the memory unit while control logic and amps of the non-volatile memory are coupled to a drain bus of the memory block, and a common potential bus of the non-volatile memory is coupled to a source bus of the memory block; and
   wherein writing data to the memory unit in the reverse write direction comprises writing data to the memory unit beginning with the last word line of the memory unit and continuing to write data to a next sequential word line in a direction of the initial word line of the memory unit while the control logic and amps of the non-volatile memory are coupled to the source bus of the memory block, and the common potential bus of the non-volatile memory is coupled to the drain bus of the memory block.

10. The method of claim 9, wherein the memory unit is a memory block.

11. The method of claim 9, wherein determining whether to write data to the memory unit in a forward direction or a reverse direction comprises:
   examining an identifier associated with the memory unit that indicates whether to write data to the memory unit beginning with the initial word line or the last word line.

12. The method of claim 11, wherein the identifier is a counter.

13. The method of claim 11, wherein the identifier is a parity bit of a program/erase cycle counter of the memory unit.

14. The method of claim 11, further comprising:
   erasing the memory unit; and
   modifying the identifier to reverse the write direction for a subsequent write of data to the memory direction.

* * * * *